United States Patent [19]
Varshney

[11] Patent Number: 4,567,580
[45] Date of Patent: Jan. 28, 1986

[54] REDUNDANCY ROLL CALL TECHNIQUE

[75] Inventor: Ramesh C. Varshney, San Jose, Calif.

[73] Assignee: Fairchild Camera & Instrument Corporation, Mountain View, Calif.

[21] Appl. No.: 508,782

[22] Filed: Jun. 29, 1983

[51] Int. Cl.⁴ .......................................... G11C 11/40
[52] U.S. Cl. .................................. 365/200; 365/201
[58] Field of Search .................. 365/200, 201; 371/10, 371/11, 21

[56] References Cited
U.S. PATENT DOCUMENTS
4,321,695  3/1982  Redwine et al. ............... 365/200 X

*Primary Examiner*—Joseph A. Popek
*Attorney, Agent, or Firm*—Townsend and Townsend

[57] ABSTRACT

A disabling circuit 71 responsive to a control signal 81 generated by applying to an IC pin 86 a signal outside the range of normal operating voltages of the device 16. The disabling circuit 71 grounds the output of are dundant address decoder such as 31 to disable a spare element 37 of the device 16, allowing identification of repaired elements.

12 Claims, 2 Drawing Figures

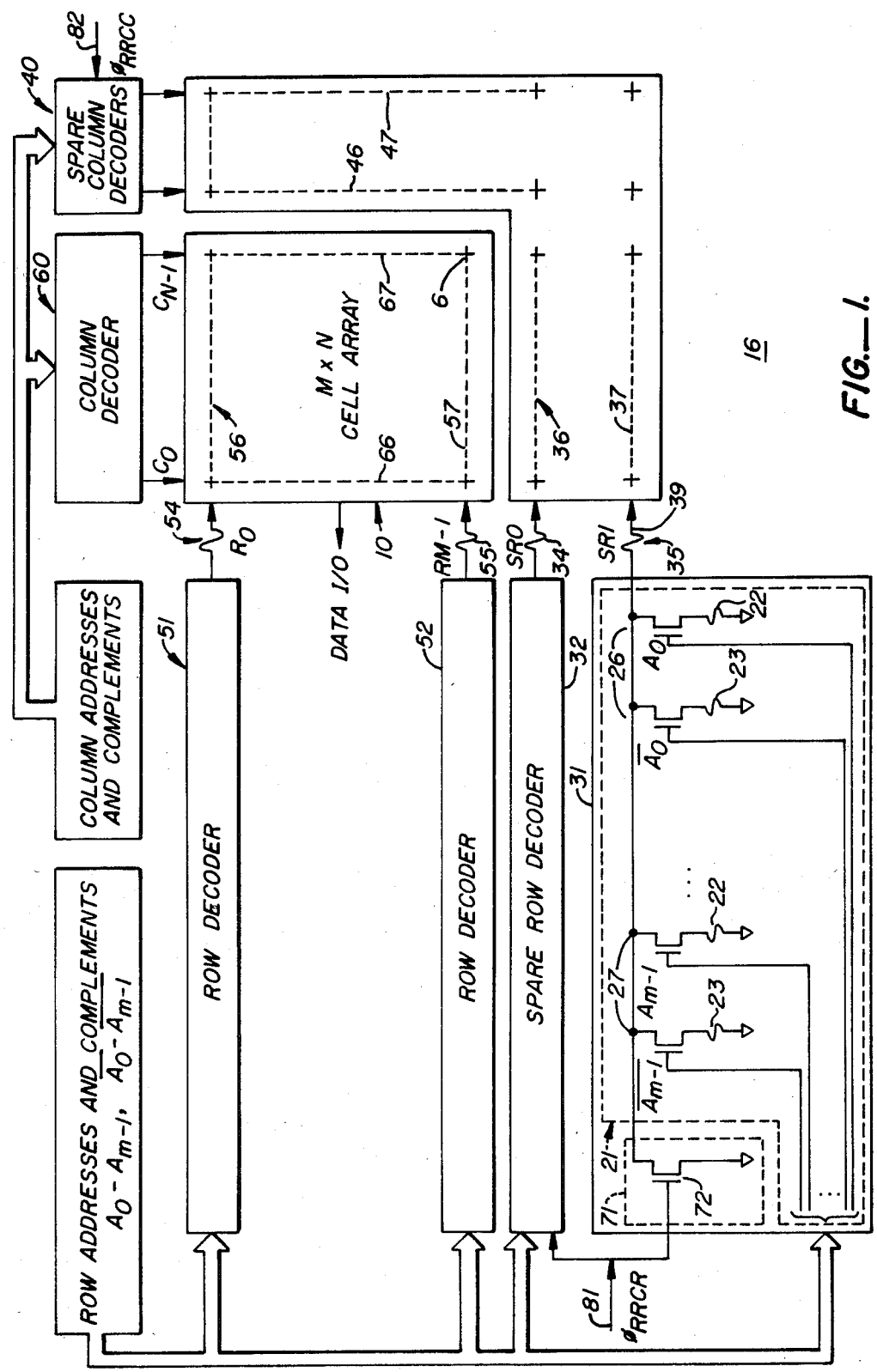
FIG._1.

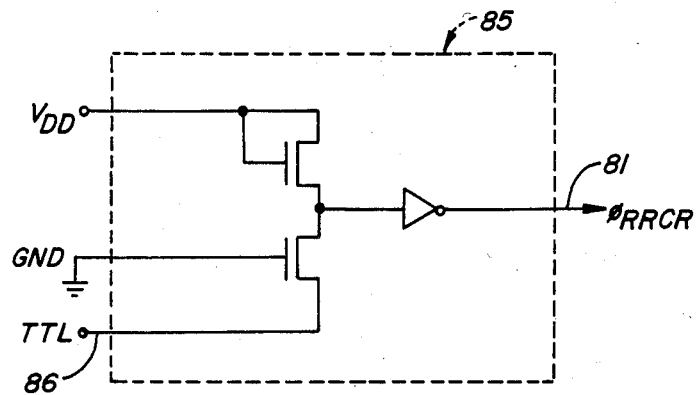
FIG._2.

REDUNDANCY ROLL CALL TECHNIQUE

BACKGROUND OF THE INVENTION

1. Field of the Invention

This invention relates to integrated circuits and specifically to integrated memories which may be repaired by activating redundant elements to replace defective elements, and to a technique of identifying repaired elements.

2. Description of the Prior Art

Electronic memories are accessed by applying to their address terminals binary signals representing the address of the desired memory element. Decoder circuits in the memory use the bit values of the address to operate switches, typically transistors, in lines between each of the memory elements and the data input/output (I/O) terminals. The logic of the decoder circuits produces a complete set of enabling signals to close the set of switches between the addressed memory location and the I/O terminals, and an incomplete set for the switches between all other memory locations and the I/O terminals. The desired memory location may then be read from or written to.

A relatively recent development in the manufacture of integrated circuits (ICs) is the provision of on-chip redundant circuit elements to improve IC manufacturing yields and economy. Defective memory cells are repaired through operations on fuses to substitute the use of extra rows and/or columns of memory cells and associated extra decoder circuits. When testing reveals a defective cell in the memory, a spare decoder circuit is customized to respond to the addresses of the defective row (or column) such that a spare row (or column) is accessed in place of the defective row (or column). According to one repair technique, the defective row (or column) is disconnected permanently from its associated decoder by laser pulse vaporization of fuses. This technique is discussed by R. P. Cenker, et al. in "A Fault-tolerant 64K Dynamic RAM," published in the Digest of Technical Papers, pages 150, 151 and 290, from the IEEE International Solid State Circuit Conference, February 1979. According to another repair technique, the defective row (or column) is disabled through on-chip logic whenever the customized spare decoder is selected. This technique is discussed by K. Kokkonen, et al. in "Redundancy Techniques for Fast Static RAMs," published in the Digest of Technical Papers, pages 80 and 81, from the IEEE International Solid State Circuit Conference, February 1981. A satisfactorily repaired IC is normally indistinguishable from an originally perfect IC.

Testing repaired memories is a problem because the data pattern has been physically altered. Even if defective memory cells have been disconnected and replaced by good cells and the memory can be tested and determined to be satisfactory, its reliability is questionable because certain kinds of defects may propagate during the operational life of the memory, and affect adjacent cells rendering the memory unusable sooner than an originally good memory. To isolate the failure rates of repaired memories from originally good memories, it is important to know whether subsequently failed cells are adjacent to repaired cells. Therefore, a need exists to identify repaired elements in packaged integrated circuits to determine the relative position of the subsequently failed elements with respect to the position of originally defective and repaired elements.

SUMMARY OF THE INVENTION

It is the primary object of this invention to provide a semiconductor device structure in which repairs are transparent to the user while the device is in normal operation, yet in which the repaired elements may be identified if desired. In a redundant memory design, this is achieved by providing, for each redundant or spare decoder, a disabling circuit controlled by a control signal to disable the redundant decoders. The control signal is generated on-chip by a test circuit having an activation threshold outside the range of signal voltages normally applied to one or more pins of the memory. During normal operation of the memory, the control signal is not generated and the disabling circuit remains inactive. Whenever the repaired elements need to be identified, a test signal outside the normal operating range is applied to one or more pins of the memory to activate the test circuit. The control signal is generated and causes the disabling circuit to disable all of the redundant decoders. In a memory device, two separate control signals may be generated by applying out-of-normal range voltages to two separate test circuits to disable all the spare row decoders, and/or all the spare column decoders, independently. The memory is then put through a normal test, and the defective elements, deprived of their repairs, become apparent.

BRIEF DESCRIPTION OF THE DRAWING

FIG. 1 shows an MOS memory having two redundant rows and two redundant columns with one of the associated redundant row decoders illustrating a disabling circuit, according to the present invention, to disable the redundant row decoder through the use of control signal $\phi_{RRCR}$; and FIG. 2 shows one of the many possible out-of-range test circuits which may be used with the invention to generate the control signals.

DETAILED DESCRIPTION OF THE PREFERRED EMBODIMENT

Referring to FIG. 1, an integrated memory circuit 16 is shown including a conventional MOS memory array 10 having m-bit row addresses, n-bit column addresses and M rows and N columns, where $M=2^m$, and $N=2^n$. For purposes of explanation, only two spare rows and two spare columns are shown. Each regular row 56, 57 (or column) is associated with a regular row (or column) decoder 51, 52 and each spare row 36, 37 (or column) is associated with a spare row (or column) decoder 32, 31. The principle of the invention applies unchanged in larger memories with more redundant rows and columns and respective decoders.

Conventional redundant decoder 21 is provided with as many pairs 26-27 of switch transistors $(A_o, \overline{A}_o)$, $(A_{m-1}, \overline{A}_{m-1})$ as there are address lines to the normal row (or column) decoders 51, 52. Each address line is applied to the gate of one transistor, and its complement to the gate of the other transistor, in a pair. One fuse 22 or 23 in each pair is opened (or closed, if originally open type fuses are used) to create a customized decoder 21 having the same logical address as whichever one of the normal decoders 51-52 is being replaced. In the preferred embodiment the fuses are opened by being vaporized using a laser.

The memory 16 may incorporate as many redundant rows and/or columns as desired, with a redundant decoder similar to 21 for each. According to the invention, each of the redundant decoders 21 is modified by the addition of a disabling circuit 71 to form a modified redundant decoder 31. If testing of the memory reveals a defect, the row (or column) in which the defect is located may be replaced by a redundant row (or column). For example, if memory cell 6 is defective, row 57 is disconnected from its decoder 52 by opening fuse 55. Redundant decoder 31 is customized to have the same logical address as disconnected decoder 52 by opening appropriate fuses 22 or 23 in each transistor pair 26-27. If, and only if, the binary value on address lines $A_0$ through $A_{m-1}$ is the binary value which would have caused decoder 52 to select row 57, no current flows through any of decoder 31 transistor pairs 26-27, and a high voltage appears on redundant decoder 31 output line 39, enabling spare row 37 in place of disconnected row 57. If the spare row 37 is also found to be defective, then another spare decoder such as 32 is customized to have the same logical address, and fuse 35 is opened to disconnect decoder 31. Repair by substitution of redundant row 37 for defective row 57 will be transparent to the user of integrated memory 16.

The present invention preserves the transparency of such repairs during operation of memory 16 within normal operating voltage ranges, and allows the repaired row (or column) to be identified during a test using a voltage outside the normal operating voltage range on one or more pins of the memory. The heart of the invention lies in the use of disabling circuit 71 in parallel with transistor pairs 26-27 in each of the redundant decoders 31 and 32. Circuit 71 is controlled by a clock signal 81 called Redundancy Roll Call signal for Row ($\phi_{RRCR}$). A similar signal 82 called Redundancy Roll Call signal for Column ($\phi_{RRCC}$) may be used with the redundant column decoder(s) 40. If desired, the same redundancy roll call signal may be used with both row and column spare decoders.

The test circuit 85, shown in FIG. 2, is connected to a TTL I/O pin 86 and generates a signal $\phi_{RRCR}$ and/or $\phi_{RRCC}$ on line 81 to redundant decoder 31, and to any other redundant decoders to which it is connected, when out-of-normal range TTL level voltages are present on pin 86. Circuit 85 generates no signals while normal TTL level voltages are present on pin 86. Other circuits which may be used for generating a control signal in response to an out-of-range test voltage are disclosed in a copending U.S. patent application entitled Programmable Address Buffer for Partial Products, Ser. No. 360,029, filed Mar. 19, 1982, by Ramesh Varshney and assigned to the assignee of this invention. A voltage on pin 86 below the normal TTL low level generates a high voltage control signal $\phi_{RRCR}$ (or $\phi_{RRCC}$) on test circuit output line 81. A high voltage control signal on line 81 causes circuit 71 to conduct and bring the output 39 of decoder 31 to ground, thereby disabling redundant decoder 31 and redundant row 37. Circuit 71 may comprise a transistor 72 similar to those in pairs 26 and 27, having its gate connected to line 81, one of its source/drain regions connected to decoder output line 39, and its other source/drain region connected to ground. During a normal operation of memory 16, the signals $\phi_{RRCR}$ and $\phi_{RRCC}$ are in a low state and the extra transistor 72 in each spare decoder is off so that it does not affect the operation of the respective spare decoders. Whenever it is desired to identify a repaired row (and/or column), the clock signal $\phi_{RRCR}$ (and/or $\phi_{RRCC}$) is generated to activate the extra transistor(s) 72, thus disabling the respective spare decoders. If the memory is tested under such a condition, all the bits in row 57, which has been disconnected from the regular decoder 52 by blowing fuse 55, will fail. In the repair technique mentioned above where the regular decoder for the defective bit is disabled by the activation of a spare decoder, the regular decoder will not be disabled since the spare decoders will not be activated, and only the defective bits in the replaced row (or column) will fail. The point of the invention is, with the redundant decoder(s) disabled, a normal test of the memory will reveal the original defects which were repaired.

Details have been disclosed to illustrate the invention in a preferred embodiment of which adaptations and modifications within the spirit and scope of the invention will occur to those skilled in the art. For example, the technique may be easily modified to work with other kinds of memories such as bipolar, CMOS, CCD, EPROM and EEPROM memories, and with any integrated circuit which employs redundancy. The scope of the invention is limited only by the following claims.

What is claimed is:

1. For use in an integrated circuit having addressable elements coupled to decoders, combinations of elements and decoders capable of being replaced through substitution of at least one redundant element and at least one redundant decoder connected to the redundant element, apparatus for disabling the redundant decoder comprising:
   a test circuit for generating a control signal, the test circuit responsive to an out-of-normal-range test signal applied to an external terminal of the integrated circuit coupled to the test circuit; and
   a disabling circuit connected to receive the control signal and connected to the redundant decoder for disabling the redundant decoder in response to the control signal.

2. Apparatus as in claim 1 wherein the integrated circuit comprises a memory circuit and the addressable elements comprise memory cells arranged in rows and columns.

3. Apparatus as in claim 2 wherein:
   the at least one redundant element comprises a first redundant row of memory cells and a first redundant column of memory cells; and
   the at least one redundant decoder comprises a first redundant row decoder coupled to the first redundant row of memory cells and a first redundant column decoder coupled to the first redundant column of memory cells.

4. Apparatus as in claim 1 wherein the test circuit comprises:
   a first potential source coupled to an output terminal;
   a second transistor having a first electrode coupled to the output terminal, a second electrode coupled to a second potential source, and a third electrode coupled to the external terminal, whereby a test signal within a normal potential range applied to the external terminal causes the test circuit to supply a first level output signal to the output terminal, and a test signal outside the normal potential range applied to the external terminal causes a second level output signal to be supplied to the output terminal.

5. Apparatus as in claim 4 wherein the second level output signal is produced by a test signal below ground potential.

6. Apparatus as in claim 5 wherein the second transistor comprises a metal-oxide-semiconductor transistor having a gate as the second electrode.

7. Apparatus as in claim 6 further comprising a third transistor connected between the first potential source and the output terminal.

8. Apparatus as in claim 1 wherein the disabling circuit comprises a switch, responsive to the control signal, for disabling the decoder.

9. Apparatus as in claim 8 wherein the switch comprises a first transistor.

10. Apparatus as in claim 9 wherein the first transistor is a metal-oxide semiconductor transistor having a gate connected to receive the control signal, a first source-drain region connected to ground, and a second source-drain region connected to the redundant decoder.

11. A method of identifying elements in an integrated circuit which have been replaced by substitution of redundant elements, which integrated circuit includes a test circuit connected to an external terminal of the integrated circuit, the test circuit for generating a control signal in response to an appropriate test signal applied to the external terminal, and which integrated circuit includes a disabling circuit connected to receive the control signal from the test circuit and in response thereto disable the redundant elements, the method comprising:

applying to the external terminal the appropriate test signal to thereby disable the redundant elements; and testing the integrated circuit with the redundant elements disabled to identify the elements which have been replaced by substitution of redundant elements.

12. A method as in claim 11 wherein the integrated circuit comprises a memory circuit, and the redundant elements comprise redundant memory cells.

* * * * *